United States Patent

[11] 3,630,795

[72] Inventor Innokent N. Vorie
Newport Beach, Calif.
[21] Appl. No. 845,003
[22] Filed July 25, 1969
[45] Patented Dec. 28, 1971
[73] Assignee North American Rockwell Corporation

[54] PROCESS AND SYSTEM FOR ETCHING METAL FILMS USING GALVANIC ACTION
3 Claims, 2 Drawing Figs.

[52] U.S. Cl. .......... 156/4, 156/18, 204/143 R, 204/248
[51] Int. Cl. .......... C23f 1/00, B23p 1/00
[50] Field of Search .......... 204/143 R, 143 GE, 32, 148, 248; 156/345, 17, 18, 4

[56] References Cited
UNITED STATES PATENTS

| | | | |
|---|---|---|---|
| 3,539,408 | 11/1970 | Cashau et al. | 204/143 R |
| 2,701,186 | 2/1955 | Hendrich et al. | 204/143 R X |
| 2,799,637 | 7/1957 | Williams | 204/143 GE |
| 2,937,124 | 5/1960 | Vaughan | 204/325 X |
| 3,401,705 | 9/1968 | Goldware | 156/345 X |
| 3,437,543 | 4/1969 | Winings | 156/17 X |

*Primary Examiner*—John H. Mack
*Assistant Examiner*—R. J. Fay
*Attorneys*—L. Lee Humphries, Edward Dugas and Robert G. Rogers

ABSTRACT: A metal film to be etched into a pattern comprising relatively fine and uniform lines is secured to a fixture. The film is ordinarily deposited on a rigid substrate. A metal frame is disposed about the edge of the film for certain metals to produce galvanic action during the etching process. The galvanic action increases the rate of etching and produces uniform etching from the outside of the film towards the center. After the film is in place, an etchant is sprayed onto the film at a relatively high velocity and constant temperature until the etching process is complete. A light source, placed behind the film, which is opaque, prior to the etching, is used to observe the etching process so that it can be discontinued when the etched pattern is eliminated.

INVENTOR.
INNOKENT N. VORIE
BY Robert G. Rogers
ATTORNEY

INVENTOR.
INNOKENT N. VORIE
BY Robert G. Rogers
ATTORNEY

PROCESS AND SYSTEM FOR ETCHING METAL FILMS USING GALVANIC ACTION

BACKGROUND OF THE INVENTION

1. Field of the Invention

The invention relates to a process and a system using a high temperature and constant velocity etchant to etch a metal film disposed on a substrate and, more particularly, to such a process using metal electrodes contacting the film to initiate galvanic action during the etching process.

2. Description of Prior Art

In etching processes, a photoresist layer is disposed on the surface of a metal film. For example, films such as chromium, aluminum and similar metals may be evaporated onto the surface of a glass substrate. The photoresist layer, which may be sprayed onto the film, is exposed to light through a mask to print a pattern in the resist layer. After the resist layer has been developed and baked, it is immersed in or sprayed by an etchant to remove the metal film not covered by the printed photoresist pattern. Subsequently, the remainder of the photoresist pattern is washed away.

Generally, such a process may require several minutes to complete. Because of the time involved, the definition of the etched lines of the pattern is usually poor. As a result, it is difficult to etch relatively uniform and fine line patterns. The manufacturing costs for producing patterns comprising lines having a width on the order of 20 micro inches and spaced on the order of 20 micro inches are usually high due to the number of defects occurring in the etched film.

Oxide coatings formed on the surface of the metal films also present problems during the etching process. The coating interferes with the etchant so that some parts of the pattern are etched more than others.

A process and system is preferred in which the manufacturing costs for masks produced by etching metal films can be substantially reduced. The process should be capable of uniformly etching the film at a relatively fast rate without interference from the oxide coating.

BRIEF SUMMARY OF THE INVENTION

Briefly, the invention comprises a process and system for uniformly etching a relatively fine pattern of lines in a thin metal film disposed on a substrate. For certain metal films, a metal frame serving as an electrode is placed in contact with the edge of the film to initiate galvanic action during the etching process. As a result, the etching is completed at a relatively fast and uniform rate. The galvanic action causes the film to be etched uniformly from the edge towards the center.

In the preferred embodiment, a light is placed behind the film being etched so that the etched surface is illuminated during the etching process. When the etching is observed to be completed, the process is discontinued.

The etchant is sprayed onto the film from a velocity controlled and temperature regulated source. The temperature at which the etchant is applied depends in part on the metal being etched. The velocity of the etchant is determined empirically to achieve the most uniform and rapid etching rate.

Therefor, it is an object of this invention to provide a process and system for achieving relatively fast and uniform etching of fine line patterns in a metal film.

A still further object of this invention is to provide a system for etching width lines in a metal film by using a metal frame in contact with the film to initiate galvanic action.

A still further object of this invention is to provide a process and system for achieving a relatively uniform and rapid etch of relatively fine lines in a metal film by applying an etchant to the film being etched at a relatively high temperature and high velocity rate.

A still further object of the invention is to provide a process and system for etching micron sized lines in a metal film, which overcomes the problems associated with oxide coatings on the metal films.

Another object of the invention is to provide a process and system for etching relatively fine lined patterns in a metal film at a rapid rate for improving the uniformity of the etched lines.

A further object of the invention is to provide a process for etching a pattern in a metal film using an etchant directed onto the surface of the metal film at a relatively high velocity and at a high temperature for reducing the period normally required to etch patterns in metal films.

A further object of the invention is to provide a process and system using a lamp behind an opaque metal film, being etched by a temperature etchant, to permit observation of the etching.

These and other objects of the invention will become more apparent when taken in connection with the description of the drawings, a brief description of which follows:

DESCRIPTION OF PREFERRED EMBODIMENT

Figure 1:
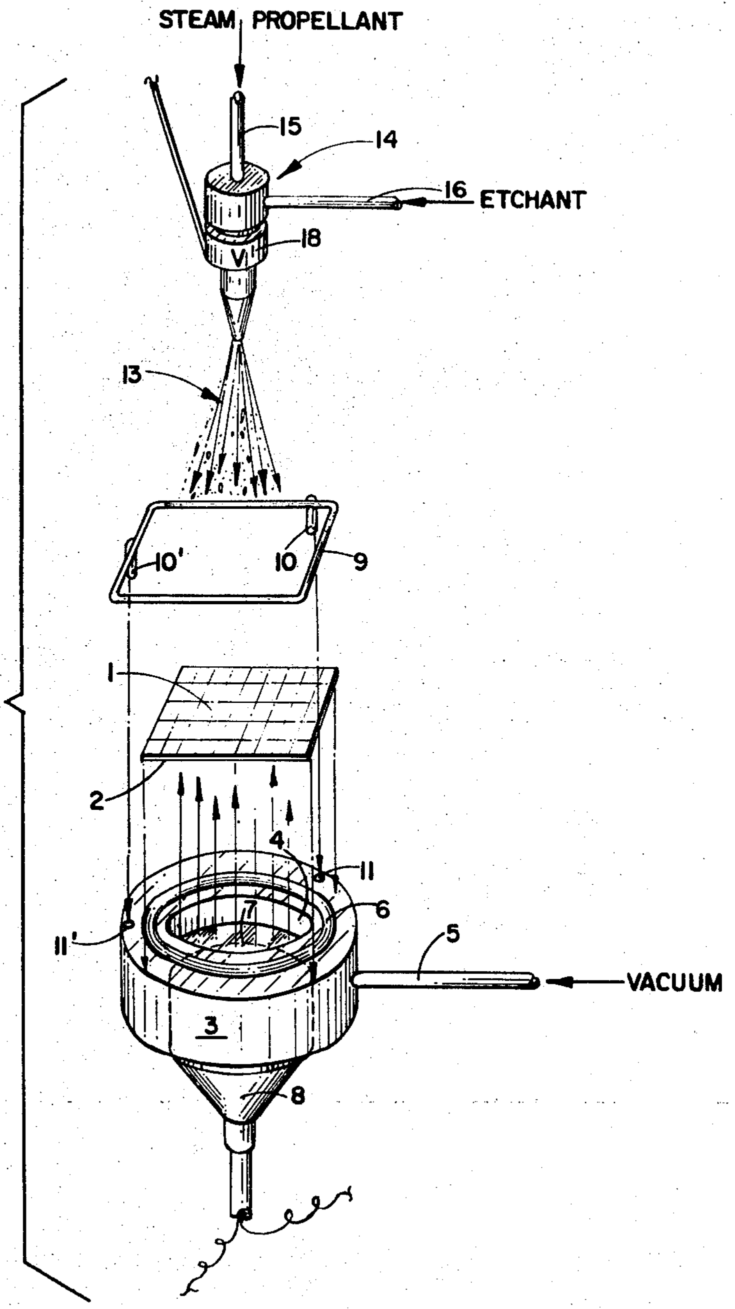
FIG. 1 is an exploded view of one embodiment of a system which can be used in a process for etching metal films into a pattern.

FIG. 1 is an exploded view of the system used in etching a pattern in the metal film 1 deposited on glass substrate 2. The substrate 2 is held in place on the surface of fixture 3 by a vacuum developed inside chamber 4 of the fixture 3. The fixture may be comprised of a Teflon or similar material which is impervious to the etchant used in the process.

Figure 2:
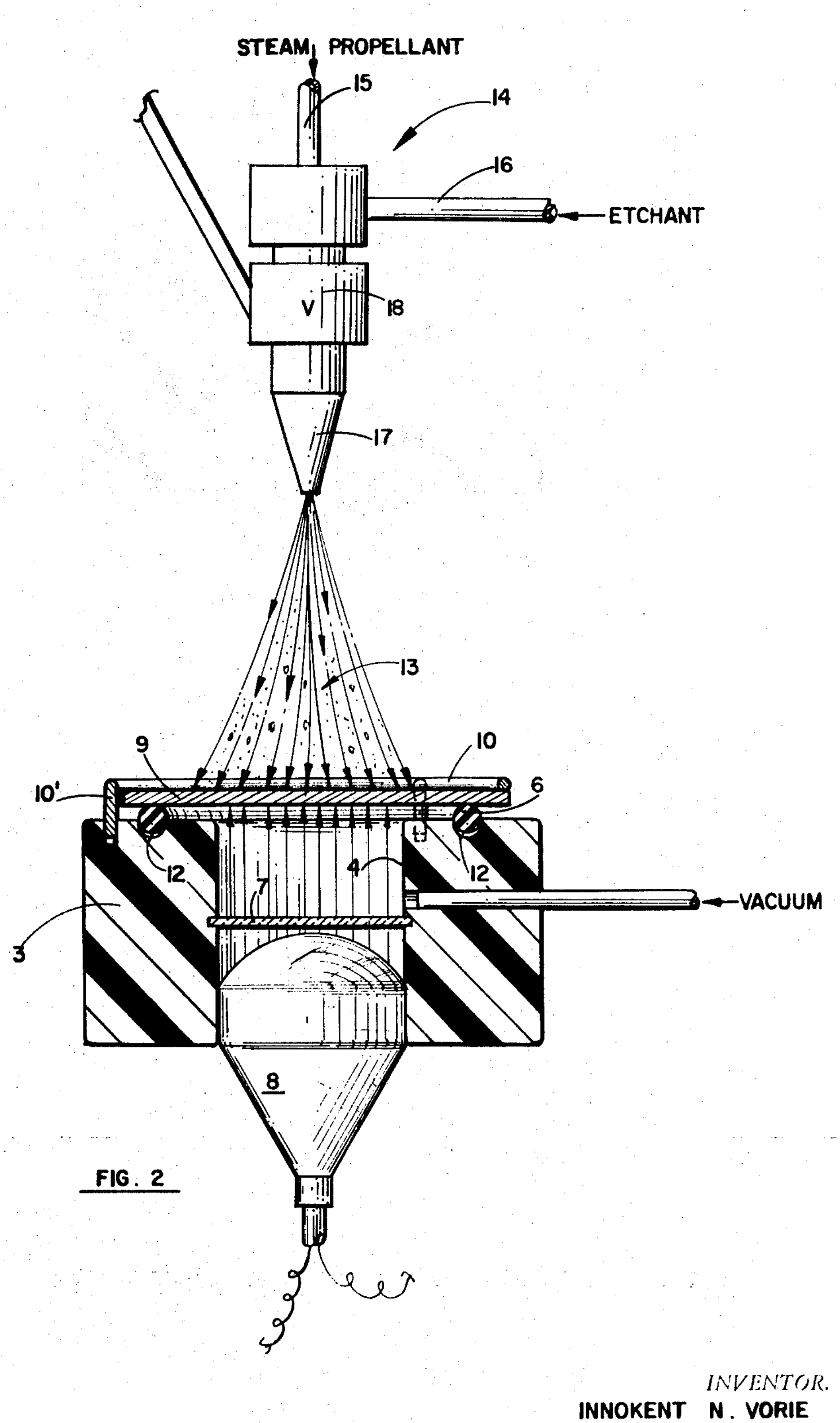
FIG. 2 is a cross-sectional view of the FIG. 1 system showing more details of the system.

One end of tube 5, which may also be comprised of Teflon, opens into chamber 4. The other end of the tube 5 is connected to a vacuum source so that air is drawn from chamber 4 when substrate 2 is in contact with rubber O-ring 6 over the chamber 4. The O-ring permits the glass substrate to seal the chamber during the etching process. A channel, shown more clearly in FIG. 2, is provided in the face of the fixture 3 to accommodate the O-ring.

Transparent plate 7, which may be comprised of glass, is secured to the bottom of the chamber. Lamp 8 is engaged inside the bottom of the fixture under plate 7 to illuminate the substrate 2 and film 1 during the etching process as described subsequently.

Metal frame 9, including downward facing prongs 10 and 10′ has a configuration for contacting the outer edges of the film 1 when in place on the fixture. For the particular embodiment shown in FIG. 1, the frame is a square configuration for contemplating the square configuration of the substrate 2. The prongs 10 and 10′ fit into holes 11 and 11′ formed in the top of fixture 3 to cooperate with the vacuum inside chamber 4 to prevent movements of the frame 9 and the substrate during the etching process.

The frame 9 is comprised of a metal which reacts with the metal film and the etchant to initiate galvanic action during the etching process. For example, if the film is chromium metal the frame would be comprised of a zinc metal. However, since a slight etching of the frame occurs, the prongs must be comprised of a metal which is inert to the etchant used. The prongs may be secured to the frame by soldering.

The etchant 13 (partially shown) is sprayed onto the metal film 1 by jet gun 14. The etchant is heated by a high temperature steam supplied to the gun through tube 15 from a steam source (not shown) the temperature of the steam is controlled to provide a more flexible etching process. The steam actually propels the etchant towards the film. In some cases, the etchant could be heated and propelled without the use of a steam, or other, propellant. In other words, some metal films etch more rapidly at one temperature while others etch more rapidly at other temperatures. The etchant is applied to the gun 14 through tube 16 from an etchant source (not shown).

The etchant 13 is emitted from the nozzle 17 of the gun under the control of valve switch 18. In a simple embodiment, the valve switch is a trigger on the gun 14 which can be squeezed to vary the size of the nozzle opening and, therefore, the velocity of the etchant is directed toward film 1.

FIG. 2 more clearly shows the position of O-ring 6 in channel 12, formed in the face of fixture 3. Substrate 2 is shown held in place over the chamber 4 by prongs 10 and 10' of frame 9. Lamp 8 fills the chamber with light to permit observation of the progress of the etching of film 1.

For purposes of describing a specific example, a 2,000 angstrom thick chromium film evaporated on a 2 inch by 2 inch glass substrate is used as an example. The frame is comprised of zinc with silver prongs soldered to the zinc frame for reasons indicated previously.

Initially the chromium film is rinsed in a mixture of sulfuric acid and chromium trioxide maintained at a temperature of approximately 160° F. The acid rinse removes the chromium oxide coatings which normally form on the film as soon as it is exposed to the air. After the acid rinse, a photoresist layer is applied over the film and the pattern to be etched; and the film is printed in the photoresist layer according to known techniques. Ordinarily, the photoresist layer is exposed to radiation such as light through a mask having the desired pattern.

After the pattern has been printed, the substrate is placed on top of O-ring 6 for sealing chamber 4. The vacuum source is activated for drawing substrate 2 tightly against O-ring 6. The zinc frame is then placed on top of the metal film so that the prongs fit in the holes provided in the top surface of fixture 3. It may be necessary to etch away the photoresist layer on the outer edges of the metal film so that good metal contact between the zinc frame and the chromium metal film is made. The frame must surround the chromium metal film so that the galvanic action can produce uniform etching from the outer edges of the film more uniformly towards the center.

In order to etch chromium, an etchant comprising glycerol, hydrolic acid, zinc chloride and chromium chloride, is used. The etchant is held at a temperature of approximately 70° F. to achieve the best etching results.

The etchant is sprayed onto the surface of the chromium metal film at a constant velocity of approximately 250–300 feet per second. As indicated above, both the velocity and temperature may be varied to accommodate different metal films and to arrive at the most suitable etchant rate.

The light source, which is usually turned on at the beginning of the process, shines through the substrate and metal film as the etched portions of the film are removed by the flow of the etchant across the surface of the film and substrate. As indicated above, the etching process begins at the outer edges of the film and substrate due to the galvanic action of the zinc and chromium in combination with the etchant. As a result, the light shows through the substrate and film initially at the outer edges and increases as the etchant increases until the entire surface is etched. As soon as the etching process is observed to have been completed, i.e., when the light shines completely through the substrate and unetched chromium film, the process is discontinued by shutting off the etchant.

Thereafter, the substrate is removed and washed. In one application, the etched metal film on the substrate may be used as a mask in producing integrated circuits.

The entire etching process requires less than 5 seconds. If the system and process described above had not been used, the process could have required several minutes. It should be obvious, therefore, that the etching period is considerably reduced. The results have also indicated that the lines of the pattern are more uniform and that the variation in the line width is substantially eliminated. It is, therefore, possible to maintain tolerances over line widths so that the production yield is increased. The test results also indicate that the edges of the lines are well defined and are sharper in many cases than the original line edges of the photographic mask used in printing the pattern.

In another example, a substrate with an aluminum film was etched. Phosphoric acid maintained at a temperature of 70° F. was used. For the aluminum, the metal frame was not required, although it could be used. If used, the metal frame should be comprised of a zinc metal. For the aluminum process, less than 15 seconds was required to complete the etching process.

Other metal films, such as gold, silver, platinum, etc., may also be etched using the above system and process. For example, a hydrocarbon film may be etched. In that case, gases other than steam may be used as the etchant propellant. In fact, the etchant could be propelled without the use of the steam propellant. For films other than those described, an etchant must be selected. For hydrocarbon, chlorine may be used. Also, the surface of a glass substrate could be etched using the above process.

In addition, the metal frame must be comprised of a metal for initiating galvanic action in the presence of the selected etchant and the metal film.

I claim:

1. A system for etching uniform and relatively fine lines in a metal film disposed on a substrate, said system comprises
- means for holding said substrate for exposing said metal film to an etchant,
- means for directing an etchant onto said exposed metal film, said etchant being maintained at a predetermined temperature and being directed onto said surface at a relatively high velocity for initiating etching of the metal film,
- light source means disposed within said means for holding and behind said substrate for passing light through said substrate and the etched metal film for observing the etching, and
- a metal frame contacting the outer edges of said metal film, said frame comprising a metal for initiating galvanic action in the presence of said film and said etchant for more uniformly and rapidly etching said metal film from the outer edges towards the center.

3. A process for etching relatively uniform and fine lines in a substrate, said substrate having a metal film disposed on its surface, said metal film being suitably masked for exposing a predetermined pattern of said metal film, said process comprising the steps of,
- securing said substrate on a fixture for exposing the surface for etching,
- placing a metallic frame on the outer edges of said metal film for initiating galvanic action when an etchant is sprayed onto the unmasked surface of said metal film for producing relative uniform and relative rapid etching from the outer edges towards the center of the metal film,
- actuating light means behind said substrate for observing the etching,
- spraying an acid etchant onto said surface, said etchant being maintained at a predetermined temperature and directed onto said surface at a relatively high velocity for uniformly and rapidly etching said surface into a pattern.

3. The process recited in claim 2 wherein said metal film is comprised of chromium, and further wherein said metal frame is comprised of zinc and is placed in contact about the edges of said metal film for initiating galvanic action when said etchant is sprayed onto said film and frame, said frame including prong means comprised of a different metal for aiding and holding said substrate in position under said sprayed etchant, said different metal being impervious to said etchant.

* * * * *